United States Patent
Koganezawa

(10) Patent No.: US 8,543,777 B2
(45) Date of Patent: Sep. 24, 2013

(54) MEMORY CONTROL APPARATUS, MEMORY CONTROL METHOD, AND COMPUTER PROGRAM WITH REFRESH COMMANDS AT OPTIMUM INTERVALS

(75) Inventor: Tomohiro Koganezawa, Chiba (JP)

(73) Assignee: Sony Corporation, Tokyo (JP)

( * ) Notice: Subject to any disclaimer, the term of this patent is extended or adjusted under 35 U.S.C. 154(b) by 1113 days.

(21) Appl. No.: 12/232,048

(22) Filed: Sep. 10, 2008

(65) Prior Publication Data
US 2009/0089494 A1    Apr. 2, 2009

(30) Foreign Application Priority Data

Sep. 28, 2007 (JP) .................................. 2007-255154

(51) Int. Cl.
*G06F 13/00* (2006.01)
(52) U.S. Cl.
USPC ........................... 711/154; 711/106; 711/167
(58) Field of Classification Search
USPC ......................................... 711/106, 154, 167
See application file for complete search history.

(56) References Cited

U.S. PATENT DOCUMENTS

| | | | | |
|---|---|---|---|---|
| 4,943,960 A | * | 7/1990 | Komatsu et al. | 365/222 |
| 5,418,754 A | * | 5/1995 | Sakakibara | 365/222 |
| 5,638,529 A | * | 6/1997 | Yee et al. | 711/106 |
| 5,644,544 A | * | 7/1997 | Mizukami | 365/222 |
| 5,651,131 A | * | 7/1997 | Chesley | 711/106 |
| 5,682,498 A | * | 10/1997 | Harness | 711/106 |
| 5,684,978 A | * | 11/1997 | Sarma et al. | 711/169 |
| 5,754,557 A | * | 5/1998 | Andrewartha | 714/718 |
| 5,848,025 A | * | 12/1998 | Marietta et al. | 365/238.5 |
| 5,912,860 A | * | 6/1999 | Schaefer | 365/233.5 |
| 5,918,242 A | * | 6/1999 | Sarma et al. | 711/5 |
| 6,075,744 A | * | 6/2000 | Tsern et al. | 365/230.03 |
| 6,226,755 B1 | * | 5/2001 | Reeves | 713/400 |
| 6,941,415 B1 | * | 9/2005 | Ryan | 711/106 |
| 6,954,388 B2 | * | 10/2005 | Thomann et al. | 365/195 |
| 2003/0200382 A1 | * | 10/2003 | Wells et al. | 711/106 |
| 2004/0062119 A1 | * | 4/2004 | Stimak et al. | 365/222 |
| 2006/0268643 A1 | * | 11/2006 | Schreck et al. | 365/222 |
| 2007/0011397 A1 | * | 1/2007 | Ryan | 711/106 |

FOREIGN PATENT DOCUMENTS

| | | |
|---|---|---|
| JP | 62-256299 A | 11/1987 |
| JP | 2006-164323 | 6/2006 |
| JP | 2007-095054 A | 4/2007 |

OTHER PUBLICATIONS

Japanese Office Action issued May 29, 2012 for corresponding Japanese Application No. 2007-255154.

* cited by examiner

*Primary Examiner* — Reba I Elmore
(74) *Attorney, Agent, or Firm* — Rader, Fishman & Grauer PLLC

(57) ABSTRACT

A memory control apparatus includes memory control sections that read and write data from and to the DRAMs. The memory control sections periodically refresh the DRAMs. The refresh rate is set to avoid the conflict of the refresh operations as well as read and write operations that consume high power. A memory control method includes connecting memories in a memory control section where the memories perform periodic refresh and perform data write, data read, and refresh operations. Refresh commands are issued at optimum intervals and with arbitrary timing such that commands that consume high power do not conflict with each other.

20 Claims, 10 Drawing Sheets

MEMORY CONTROL APPARATUS, MEMORY CONTROL METHOD, AND COMPUTER PROGRAM WITH REFRESH COMMANDS AT OPTIMUM INTERVALS

CROSS REFERENCES TO RELATED APPLICATIONS

The present invention contains subject matter related to Japanese Patent Application JP 2007-255154, filed in the Japan Patent Office on Sep. 28, 2007, the entire contents of which being incorporated herein by reference.

BACKGROUND OF THE INVENTION

1. Field of the Invention

The present invention relates to a memory control apparatus, a memory control method, and a computer program. In particular, the present invention relates to a memory control apparatus, a memory control method, and a computer program for controlling a plurality of memories that require periodic refresh.

2. Description of the Related Art

In electronic devices such as digital cameras or camcorders, dynamic random access memories (DRAMs) are widely used as memory elements for storing data. Types of the DRAMs include double data rate (DDR), DDR2, and low power double data rate (LPDDR).

An increasing number of electronic devices equipped with the DRAMs adopt a system with a plurality of DRAMs with the view of increasing storage capacity.

Because of its structure, the DRAM requires periodic refresh to hold data, and if the refresh is not performed, the data therein will be lost. The refresh operation, however, requires a large operating current, and when the refresh operations for a plurality of DRAMs conflict with each other, a correspondingly large operating current is needed.

As such, a technique has been disclosed for controlling timing with which the refresh operations, which require a large operating current, are performed in order to avoid the conflict of the refresh operations (see, for example, Japanese Patent Laid-open No. 2006-164323 (hereinafter referred to as Patent Document 1)).

SUMMARY OF THE INVENTION

In some types of DRAMs, however, a read operation requires a larger current than the refresh operation. In such types of DRAMs, a conflict of read operations results in a higher peak current than a peak current caused by the conflict of refresh operations.

The DRAMs have different optimum refresh intervals depending on their capacity. For example, 256 MB DRAMs require 4096 refresh operations every 64 milliseconds, whereas 512 MB DRAMs require 8192 refresh operations every 64 milliseconds. A method as disclosed in Patent Document 1 has a problem in that an optimum number of refresh operations cannot be performed when the DRAMs differ in capacity.

The present invention addresses the above-identified, and other problems associated with methods and apparatuses in related art, and provides a memory control apparatus, a memory control method, and a computer program which allow arbitrary setting of the timing with which the refresh operations are performed and are capable of avoiding not only the conflict of the refresh operations but also a conflict of commands for operations that consume high power, such as write/read operations, in order to prevent an increase in peak current.

According to one embodiment of the present invention, there is provided a memory control apparatus including a plurality of memory control sections, each of which has connected thereto one or more memories that require periodic refresh and is configured to perform data write, data read, and refresh operations on the one or more memories. The memory control sections issue, to each of the one or more memories, refresh commands at optimum intervals and with arbitrary timing such that commands that consume high power do not conflict with each other.

According to the above memory control apparatus, the memory control sections issue, to each of the one or more memories, the refresh commands at optimum intervals and with arbitrary timing such that the commands that consume high power do not conflict with each other. Thus, the timing with which the refresh operations are performed can be set arbitrarily so as to avoid the conflict of the refresh operations and write/read operations, which consume high power, whereby an increase in peak current can be prevented.

Each of the memory control sections may include a memory control setting section configured to set a threshold number of conflicts of write/read commands and the refresh commands. According to the above memory control apparatus, a memory control setting section is configured to set a threshold number of conflicts of write/read commands and the refresh commands. Thus, in the case where conflicts of write/read commands and the refresh commands occur, conflicts are allowed until exceeding the threshold number.

The memory control setting section may be capable of setting a maximum wait time for which issuance of a refresh request is suspended when the number of occurring conflicts exceeds the threshold number. According to the above memory control apparatus, the memory control setting section is configured to be capable of setting a maximum wait time for which issuance of a refresh request is suspended when the number of occurring conflicts exceeds the threshold number. Thus, in the case where conflicts of write/read commands and the refresh commands occur even after exceeding the threshold number, the refresh request is suspended until the maximum wait time has elapsed, whereby an increase in peak current can be prevented.

If the number of occurring conflicts continues to exceed the threshold number even after the maximum wait time has elapsed, one of the memory control sections may cause one of the memory control sections that is continually performing a write/read operation on the memory to suspend issuance of the write/read commands upon completion of a current burst transfer. Thus, conflicts of write/read commands and the refresh commands are avoided by giving priority to issuance of the refresh command, whereby an increase in peak current can be prevented.

According to another embodiment of the present invention, there is provided a memory control apparatus including a memory control section that has connected thereto a plurality of memories that require periodic refresh and is configured to perform data write, data read, and refresh operations on the memories. The memory control section issues, to each of the memories, refresh commands at optimum intervals and with arbitrary timing such that commands that consume high power do not conflict with each other.

According to the above memory control apparatus, the memory control section issues, to each of the memories, the refresh commands at optimum intervals and with arbitrary timing such that commands that consume high power do not conflict with each other. Thus, the timing with which the refresh operations are performed can be set arbitrarily so as to avoid the conflict of the refresh operations and the write/read operations, which consume high power, whereby an increase in peak current can be prevented.

Each of the memory control sections may include a memory control setting section configured to set a threshold number of conflicts of write/read commands and the refresh commands. According to the above memory control apparatus, a memory control setting section is configured to set a threshold number of conflicts of write/read commands and the refresh commands. Thus, in the case where conflicts of write/read commands and the refresh commands occur, conflicts are allowed until exceeding the threshold number.

The memory control setting section may be capable of setting a maximum wait time for which issuance of a refresh request is suspended when the number of occurring conflicts exceeds the threshold number. According to the above memory control apparatus, the memory control setting section is configured to be capable of setting a maximum wait time for which issuance of a refresh request is suspended when the number of occurring conflicts exceeds the threshold number. Thus, in the case where conflicts of write/read commands and the refresh commands occur even after exceeding the threshold number, the refresh request is suspended until the maximum wait time has elapsed, whereby an increase in peak current can be prevented.

If the number of occurring conflicts continues to exceed the threshold number even after the maximum wait time has elapsed, one of the memory control sections may cause one of the memory control sections that is continually performing a write/read operation on the memory to suspend issuance of the write/read commands upon completion of a current burst transfer. Thus, conflicts of write/read commands and the refresh commands are avoided by giving priority to issuance of the refresh command, whereby an increase in peak current can be prevented.

According to yet another embodiment of the present invention, there is provided a memory control method employed in a memory control apparatus including a plurality of memory control sections, each of which has connected thereto one or more memories that require periodic refresh and is configured to perform data write, data read, and refresh operations on the one or more memories. The method includes the step of issuing, to each of the one or more memories, refresh commands at optimum intervals and with arbitrary timing such that commands that consume high power do not conflict with each other.

According to the above memory control method, the refresh commands are issued to each of the one or more memories at optimum intervals and with arbitrary timing such that commands that consume high power do not conflict with each other. Thus, the timing with which the refresh operations are performed can be set arbitrarily so as to avoid the conflict of the refresh operations and the write/read operations, which consume high power, whereby an increase in peak current can be prevented.

According to yet another embodiment of the present invention, there is provided a memory control method employed in a memory control apparatus including a memory control section that has connected thereto a plurality of memories that require periodic refresh and is configured to perform data write, data read, and refresh operations on the memories. The method includes the step of issuing, to each of the memories, refresh commands at optimum intervals and with arbitrary timing such that commands that consume high power do not conflict with each other.

According to the above memory control method, the refresh commands are issued to each of the memories at optimum intervals and with arbitrary timing such that commands that consume high power do not conflict with each other. Thus, the timing with which the refresh operations are performed can be set arbitrarily so as to avoid the conflict of the refresh operations and the write/read operations, which consume high power, whereby an increase in peak current can be prevented.

According to yet another embodiment of the present invention, there is provided a computer program for causing a computer to perform data write, data read, and refresh operations on one or more connected memories that require periodic refresh. The program causes the computer to perform the step of issuing, to each of the one or more memories, refresh commands at optimum intervals and with arbitrary timing such that commands that consume high power do not conflict with each other.

According to the above computer program, the refresh commands are issued to each of the one or more memories at optimum intervals and with arbitrary timing such that commands that consume high power do not conflict with each other. Thus, the timing with which the refresh operations are performed can be set arbitrarily so as to avoid the conflict of the refresh operations and the write/read operations, which consume high power, whereby an increase in peak current can be prevented.

According to yet another embodiment of the present invention, there is provided a computer program for causing a computer to perform data write, data read, and refresh operations on a plurality of connected memories that require periodic refresh, the program causing the computer to perform the step of issuing, to each of the memories, refresh commands at optimum intervals and with arbitrary timing such that commands that consume high power do not conflict with each other.

According to the above computer program, the refresh commands are issued to each of the memories at optimum intervals and with arbitrary timing such that commands that consume high power do not conflict with each other. Thus, the timing with which the refresh operations are performed can be set arbitrarily so as to avoid the conflict of the refresh operations and the write/read operations, which consume high power, whereby an increase in peak current can be prevented.

As described above, the present invention provides the memory control apparatuses, the memory control methods, and the computer programs which allow the timing with which the refresh operations are performed to be set arbitrarily so as to avoid the conflict of not only the refresh operations but also the write/read operations, which consume high power, so that an increase in peak current can be prevented.

DETAILED DESCRIPTION OF THE PREFERRED EMBODIMENTS

Figure 1:
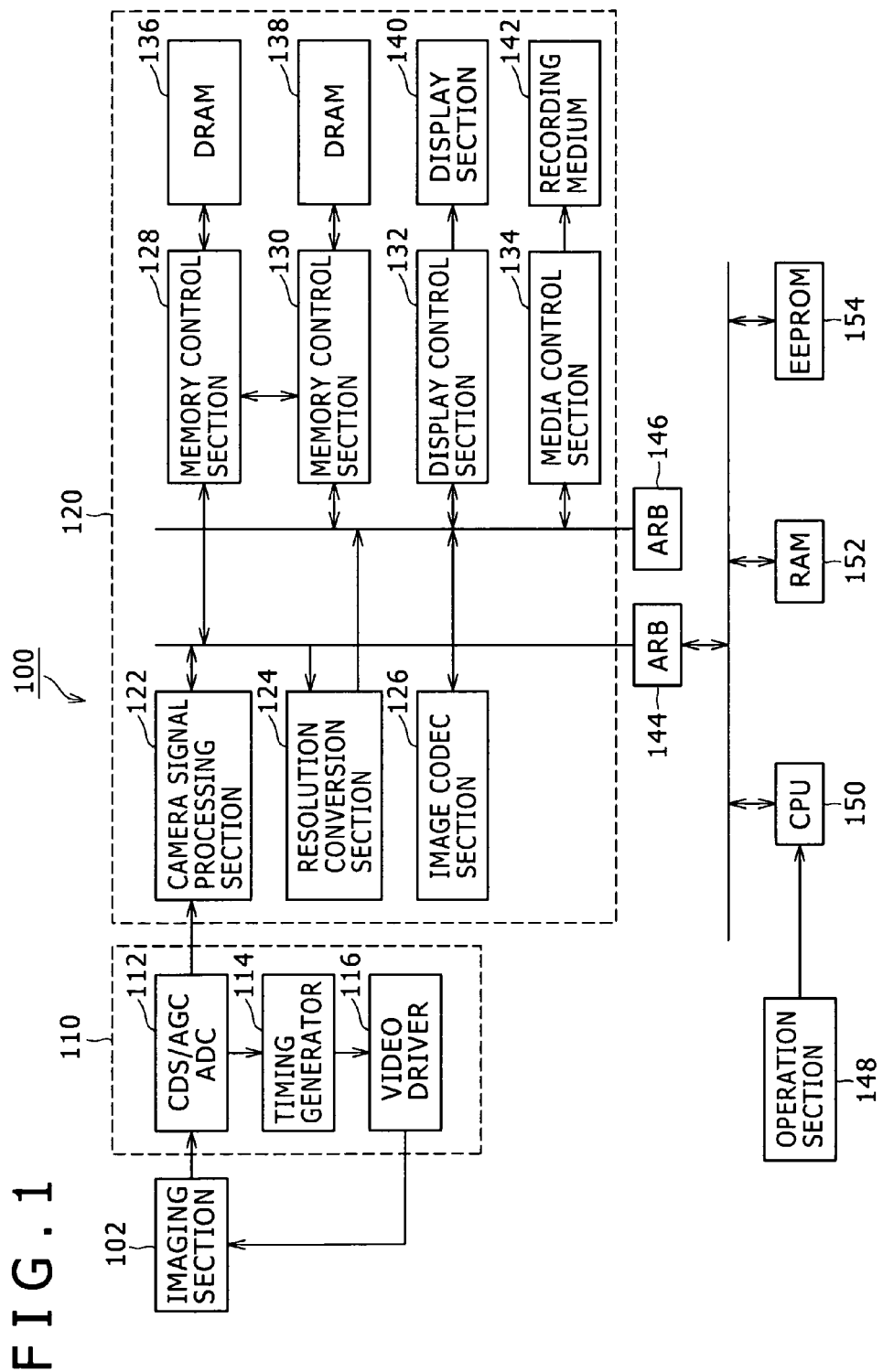
FIG. 1 is a block diagram illustrating the structure of a digital still camera according to a first embodiment of the present invention.

Hereinafter, preferred embodiments of the present invention will be described in detail with reference to the accompanying drawings. Note that, in the present specification and the accompanying drawings, elements having substantially the same functional structures will be assigned the same reference numerals, and redundant explanations will be omitted.

First Embodiment

First, a digital still camera including a memory control apparatus according to a first embodiment of the present invention will be described below.

FIG. 1 is a block diagram illustrating the structure of the digital still camera 100 according to the first embodiment of the present invention. The structure of the digital still camera 100 according to the first embodiment of the present invention will now be described in detail below with reference to FIG. 1.

As shown in FIG. 1, the digital still camera 100 according to the first embodiment of the present invention includes an imaging section 102, an image preprocessing section 110, an image processing section 120, a first arbitration section (ARB) 144, a second arbitration section 146, an operation section 148, a central processing unit (CPU) 150, a random-access memory (RAM) 152, and an EEPROM 154.

The imaging section 102 converts a light from a subject into an electrical signal. Although not shown, the imaging section 102 includes a zoom lens, a diaphragm, a focus lens, and an imaging device such as a charge-coupled device (CCD) or a complementary metal oxide semiconductor (CMOS) device.

The image preprocessing section 110 converts imaging data obtained by the imaging section 102 into digital image data and outputs the digital image data. The image preprocessing section 110 includes a CDS/AGC ADC 112, a timing generator 114, and a video driver 116.

The CDS/AGC ADC 112 is a combination of a correlated double sampling (CDS) circuit integrated with an automatic gain control (AGC) circuit and an A/D converter. The CDS circuit is one type of sampling circuit for removing noise in the electrical signal outputted from the imaging section 102. In the present embodiment, the CDS circuit is integrated with the AGC circuit, which is used to amplify the electrical signal after the noise is removed therefrom. The A/D converter converts an analog signal outputted from the CDS circuit and the AGC circuit into the digital image data, and outputs the digital image data to the image processing section 120.

The timing generator 114 generates a timing signal to be inputted to the imaging section 102. The video driver 116 outputs the timing signal generated by the timing generator 114 to the imaging section 102.

The image processing section 120 performs signal processing on the digital signal generated by the image preprocessing section 110 to obtain image data. The image processing section 120 includes a camera signal processing section 122, a resolution conversion section 124, an image codec section 126, memory control sections 128 and 130, a display control section 132, a media control section 134, DRAMs 136 and 138, a display section 140, and a recording medium 142.

The camera signal processing section 122 performs signal processing on the image data supplied from the image preprocessing section 110. Examples of the signal processing performed by the camera signal processing section 122 include gain correction for the quantity of light and white balance adjustment. The image data subjected to the signal processing in the camera signal processing section 122 is supplied to the memory control section 128.

The resolution conversion section 124 performs a process of converting the resolution of the image data. In the present embodiment, the resolution conversion section 124 reads image data stored in the DRAM 136 and converts the resolution of the image data. The resolution-converted image data is stored in the DRAM 138, and the image data stored therein is displayed on the display section 140.

The image codec section 126 performs a codec process on the image data. In the present embodiment, the image codec section 126 performs a process of compressing the image data into JPEG, MPEG, or other formats when the image data is recorded on the recording medium 142.

The memory control sections 128 and 130 control reading and writing of data from or to the DRAMs 136 and 138. In addition, the memory control sections 128 and 130 issue commands for periodically refreshing the DRAMs 136 and 138, in order to refresh the DRAMs 136 and 138.

The display control section 132 controls displaying of images on the display section 140. The media control section 134 controls recording and reading of the images onto or from the recording medium 142.

The DRAMs 136 and 138 store the image data temporarily. The storage of the data in the DRAM 136 and the reading of the data from the DRAM 136 are controlled by the memory control section 128. Similarly, the storage of the data in the DRAM 138 and the reading of the data from the DRAM 138 are controlled by the memory control section 130. Data write requests and data read requests to the memory control sections 128 and 130 are arbitrated by the first arbitration section 144 and the second arbitration section 146.

The image data is displayed on the display section 140. The displaying of the image data on the display section 140 is performed by the display control section 132. Examples of the display section 140 include a liquid crystal display (LCD).

The image data obtained by imaging is recorded on the recording medium 142. Examples of the recording medium 142 include a hard disk, various types of flash memories, and an optical disc.

As noted previously, the first arbitration section 144 and the second arbitration section 146 arbitrate the data write requests and the data read requests to the memory control sections 128 and 130.

The operation section 148 is used to manipulate the digital still camera 100. Although not shown in FIG. 1, the operation section 148 has arranged thereon a shutter button for photographing, a cross key for selecting an image to be displayed on the display section 140, a button for deleting an image recorded on the recording medium 142, and so on.

The CPU 150 controls various parts of the digital still camera 100. The CPU 150 sequentially reads a computer program stored in the RAM 152 to control the digital still camera 100.

The computer program to be executed by the CPU 150 is stored in the RAM 152. Data and parameters for the operation of the digital still camera 100 are stored in the EEPROM 154.

The digital still camera 100 according to the first embodiment of the present invention has been described above. The digital still camera 100 according to the first embodiment of the present invention uses two DRAMs as shown in FIG. 1. In systems in which two DRAMs are used, the refresh, read, and write operations for one DRAM are performed independently. As such, when those operations are performed simultaneously for the two DRAMs, the peak current increases greatly.

As such, in the first embodiment of the present invention, it is possible to arbitrarily set the timing with which the refresh operations are performed, and avoid a conflict of write/read operations as well as a conflict of refresh operations, thereby preventing an increase in peak current.

Figure 2:
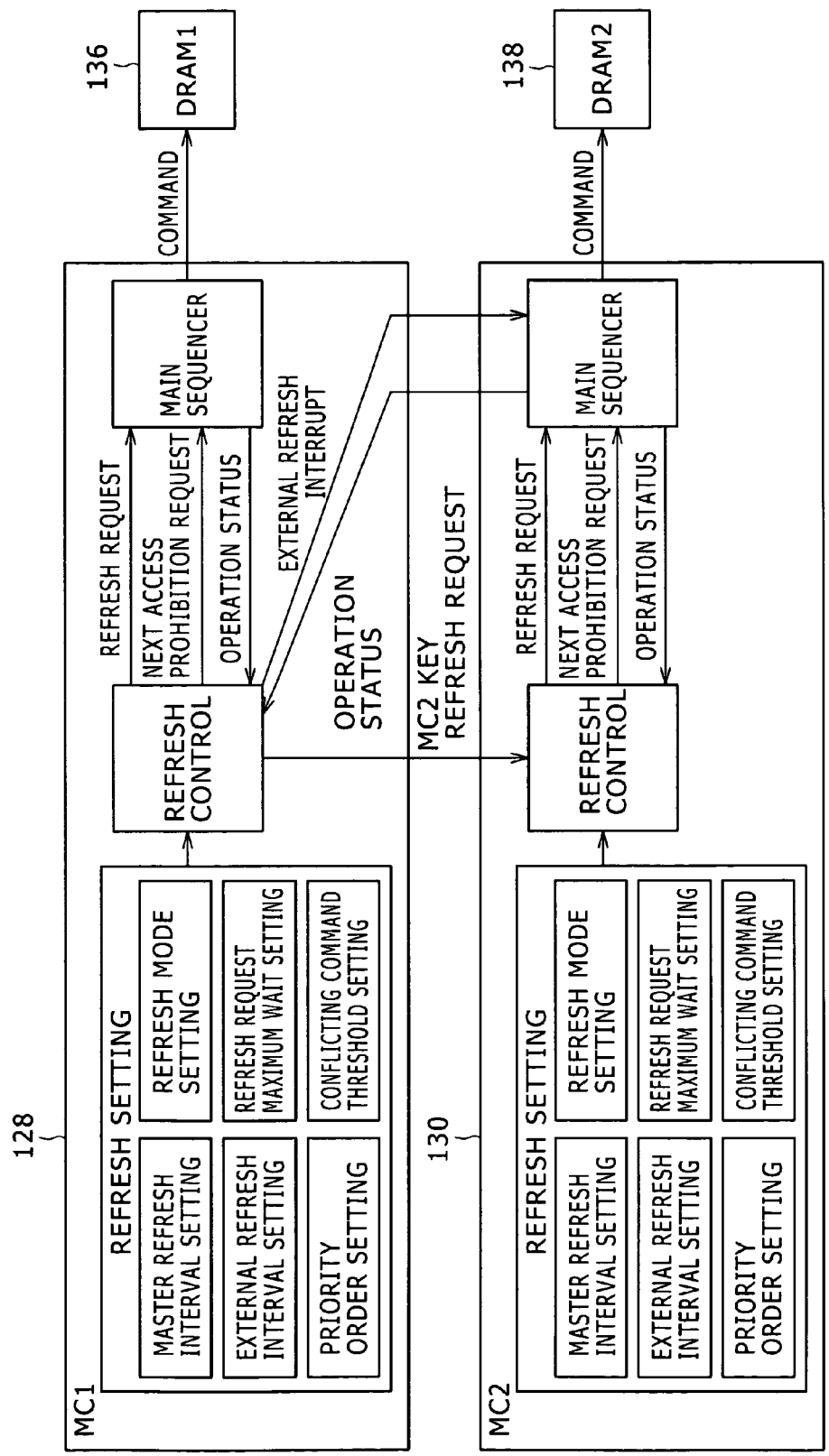
FIG. 2 is a diagram for explaining memory control sections according to the first embodiment of the present invention.

FIG. 2 is a diagram for explaining the memory control sections 128 and 130 according to the first embodiment of the present invention. The memory control sections 128 and 130 according to the first embodiment of the present invention will now be described in detail below with reference to FIG. 2.

As noted previously, the memory control section 128 makes the refresh, read, and write requests to the DRAM 136, whereas the memory control section 130 makes the refresh, read, and write requests to the DRAM 138. With the intermediacy of the memory control section 130, the memory control section 128 controls the timing with which to make the refresh, read, and write requests to the DRAM 138.

The memory control section 128 includes a refresh setting section 162, a refresh control section 164, and a main sequencer 166. Similarly, the memory control section 130 includes a refresh setting section 172, a refresh control section 174, and a main sequencer 176.

The refresh setting section 162 is an example of a memory control setting section according to an embodiment of the present invention, and is used to make various settings concerning the refresh requests to the DRAM 136. Items set in the refresh setting section 162 include master refresh interval setting, refresh mode setting, external refresh interval setting, refresh request maximum wait setting, priority order setting, and conflicting command threshold setting. Each of the items set in the refresh setting section 162 will now be described in detail below.

The master refresh interval setting is used to set a refresh interval of the DRAM 136, which is directly connected to the memory control section 128. In the case where the DRAM 136 has a capacity of 256 MB, for example, the optimum number of refresh operations to be performed every 64 milliseconds is 4096, and accordingly, a refresh interval that allows 4096 refresh operations to be performed every 64 milliseconds is set in the master refresh interval setting.

The refresh mode setting is used to set whether the refresh request to the DRAM 136, which is directly connected to the memory control section 128, is to be made by the memory control section 128 itself (an internal refresh mode) or by another memory control section (an external refresh mode). In the external refresh mode, the memory control section 128 receives a signal for initiating the refresh request from the other memory control section to make the refresh request. The external refresh interval setting is used to set a refresh interval of the DRAM 138, which is connected to another memory control section than the memory control section 128.

The conflicting command threshold setting is used to set the maximum permissible number of conflicts between refresh commands for the refresh requests and read/write commands. For example, suppose that "2" is set in the conflicting command threshold setting in the present embodiment. In this case, when a read command issued by the memory control section 128 and a refresh command issued by the memory control section 130 are to be executed simultaneously, simultaneous execution of the two commands is permitted.

The refresh request maximum wait setting is used to set a wait time for which issuance of the refresh command is suspended when the number of commands issued exceeds the threshold set in the conflicting command threshold setting. In the case where there are a plurality of memory control sections, each memory control section issues the read/write command independently, and therefore the number of commands issued simultaneously may continue to be greater than the threshold set in the conflicting command threshold setting for a long time. In some types of DRAMs, the maximum interval between refreshes is defined as a refresh cycle (tREFi)×8 or the like. Accordingly, even when the number of commands issued simultaneously exceeds the threshold set in the conflicting command threshold setting, the refresh command is issued after the wait time set in the refresh request maximum wait setting has elapsed.

The priority order setting is used to set the order of priority in which to suspend access from the memory control sections when the number of commands issued simultaneously continues to exceed the threshold set in the conflicting command threshold setting even after the wait time set in the refresh request maximum wait setting has elapsed.

Suppose, for example, that there are five memory control sections and that they are denoted as MC1, MC2, MC3, MC4, and MC5, respectively. Also suppose that a conflict of a maximum of two commands is permitted in the conflicting command threshold setting, and that the order of priority set in the priority order setting is MC1>MC2>MC3>MC4>MC5.

In this case, if MC1, MC3, and MC4 are performing the read operations and MC2 is attempting to issue the refresh request, MC2 issues the refresh command when MC4, which is ranked lowest of the three in the order of priority, has completed a current access to the DRAM, and the next access by MC4 to the DRAM is suspended until MC2 completes the refresh request.

The items set in the refresh setting section 162 have been described above. By making the above-described settings concerning the refresh request to the DRAM 136 in the refresh setting section 162, it is possible to arbitrarily set the timing with which the refresh operations are performed even when there are a plurality of DRAMs, and to avoid the conflict of the write/read operations as well as the conflict of the refresh operations to prevent an increase in peak current.

Based on the items set in the refresh setting section 162, the refresh control section 164 notifies the main sequencer 166 or the refresh control section 174 in the memory control section 130 of the refresh request. The refresh control section 164 contains a refresh counter and a wait counter.

When the internal refresh mode is set in the refresh mode setting in the refresh setting section 162, the refresh counter is started, and when the value of the refresh counter has become a predetermined value, the refresh request is issued to the main sequencer 166. On the other hand, when the external refresh mode is set in the refresh mode setting in the refresh setting section 162, the refresh counter is started, and when the value of the refresh counter has become a predetermined value, the refresh request is issued to the refresh control section 174 in the memory control section 130.

Suppose that the refresh request maximum wait setting is enabled and the value of the refresh counter has become a value corresponding to the refresh interval set in the master refresh interval setting (or the external refresh interval setting). If, at this time, the number of commands issued simultaneously is greater than the threshold set in the conflicting command threshold setting, the wait counter starts counting.

The main sequencer 166 generates and issues the commands for the DRAM 136 in compliance with AC specifications of a device that uses the write command, the read command, the refresh command, and so on.

Similar to the refresh control section 164, the refresh control section 174 notifies the main sequencer 176 of the refresh request. In the present embodiment, the refresh control section 174 receives, from the refresh control section 164, the notification of the refresh request to the DRAM 138.

Similar to the main sequencer 166, the main sequencer 176 generates and issues the commands for the DRAM 138 in compliance with AC specifications of a device that uses the write command, the read command, the refresh command, and so on.

The memory control sections 128 and 130 according to the first embodiment of the present invention have been described above. Next, operations of the memory control sections 128 and 130 according to the first embodiment of the present invention will now be described below. In the following description, by way of example, the memory control section 128 is assumed to be a master and control refresh cycles of the DRAMs 136 and 138.

In order for the memory control section 128 to be set as the master, the refresh mode setting in the refresh setting section 162 is set to the internal refresh mode, the refresh interval of the DRAM 136 is set in the master refresh interval setting, and the refresh interval of the DRAM 138 is set in the external refresh interval setting.

Various examples of control, with different refresh intervals of the DRAMs 136 and 138, will now be described below.

Figure 3:
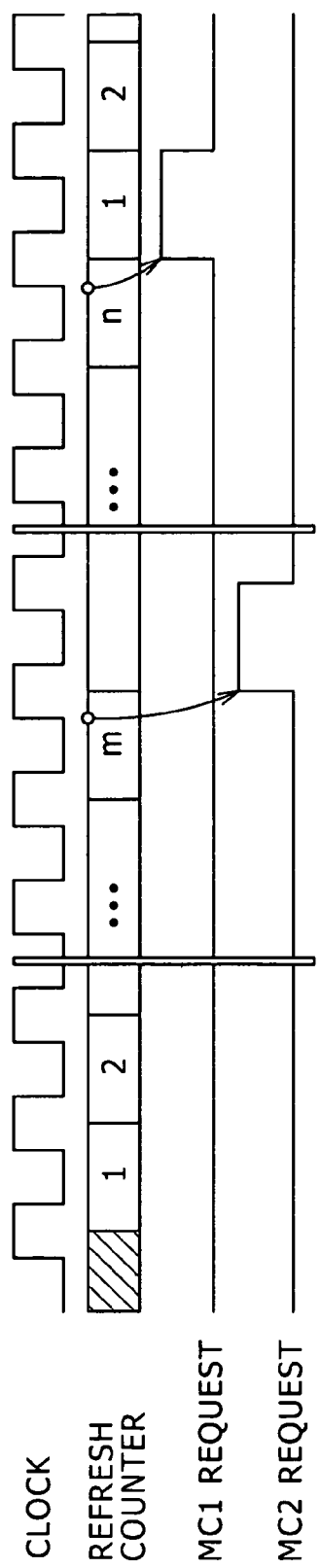
FIG. 3 is a diagram for explaining a case where a DRAM, which is connected to the memory control section, and a DRAM, which is connected to the memory control section, have the same refresh interval.

FIG. 3 is a diagram for explaining a case where the DRAM 136, which is connected to the memory control section 128 (MC1), and the DRAM 138, which is connected to the memory control section 130 (MC2), have the same refresh interval.

In this case, the memory control section 130 is notified of the refresh request to the DRAM 138 (MC2 request) when the refresh counter in the refresh control section 164 has reached m (m is a natural number), and the main sequencer 166 is notified of the refresh request to the DRAM 136 (MC1 request) when the refresh counter in the refresh control section 164 has reached n (n is a natural number greater than m).

As described above, the notification of the refresh requests to the two DRAMs is provided at different times so that two refresh operations may not conflict, whereby an increase in operating current is prevented.

Figure 4:
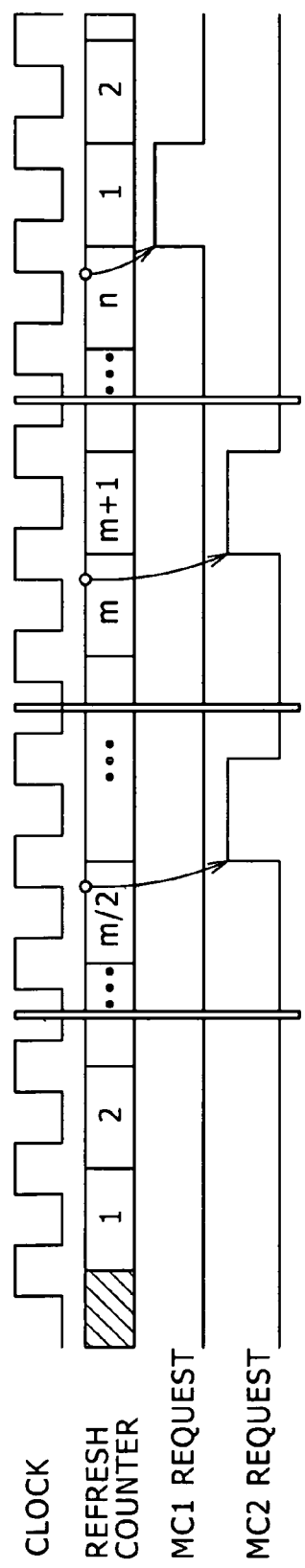
FIG. 4 is a diagram for explaining a case where the DRAM, which is connected to the memory control section, and the DRAM, which is connected to the memory control section, have different refresh intervals.

FIG. 4 is a diagram for explaining a case where the DRAM 136, which is connected to the memory control section 128 (MC1), and the DRAM 138, which is connected to the memory control section 130 (MC2), have different refresh intervals. Specifically, it is assumed that the DRAM 136 needs 4096 refresh operations every 64 milliseconds, whereas the DRAM 138 needs 8192 refresh operations every 64 milliseconds.

In this case, the memory control section 130 needs to issue twice as many refresh requests as the memory control section 128 in a given period. Accordingly, the memory control section 130 is notified of the refresh request to the DRAM 138 (MC2 request) when the refresh counter in the refresh control section 164 has reached m/2 and m (m is an even natural number), whereas the main sequencer 166 is notified of the refresh request to the DRAM 136 (MC1 request) when the refresh counter in the refresh control section 164 has reached n (n is a natural number greater than m).

In this case also, the notification of the refresh requests to the two DRAMs is provided at different times as described above so that two refresh operations may not conflict, whereby an increase in operating current is prevented.

Figure 5:
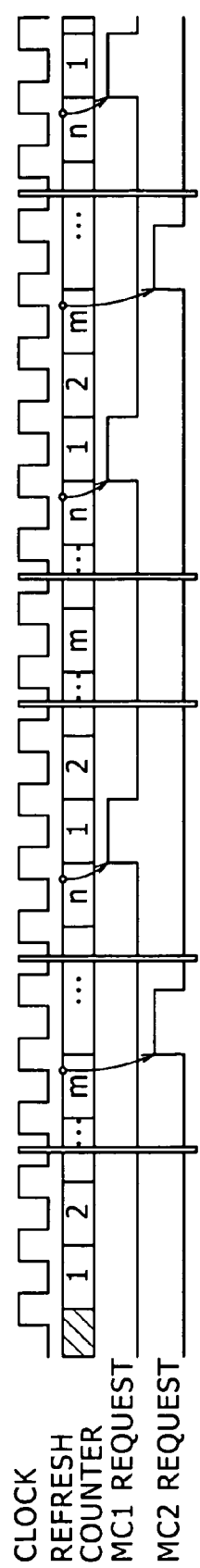
FIG. 5 is a diagram for explaining a case where the DRAM, which is connected to the memory control section, and the DRAM, which is connected to the memory control section, have different refresh intervals.

FIG. 5 is a diagram for explaining a case where the DRAM 136, which is connected to the memory control section 128 (MC1), and the DRAM 138, which is connected to the memory control section 130 (MC2), have different refresh intervals. Specifically, it is assumed here that, in contrast to the case as shown in FIG. 4, the DRAM 136 needs 8192 refresh operations every 64 milliseconds whereas the DRAM 138 needs 4096 refresh operations every 64 milliseconds.

In this case, the memory control section 128 needs to issue twice as many refresh requests as the memory control section 130. Accordingly, the memory control section 130 is notified of the refresh request to the DRAM 138 (MC2 request) when the refresh counter in the refresh control section 164 has reached m (m is a natural number) but only every other time, whereas the main sequencer 166 is notified of the refresh request to the DRAM 136 (MC1 request) when the refresh counter in the refresh control section 164 has reached n (n is a natural number greater than m).

In this case also, the notification of the refresh requests to the two DRAMs is provided at different times as described above so that two refresh operations may not conflict, whereby an increase in operating current is prevented.

Three exemplary cases have been described above where the memory control section 128 functions as the master to control the refresh cycles of the DRAMs 136 and 138.

Next, the case will be described where the memory control section 128 controls the refresh cycles of the DRAMs 136 and 138 so as to avoid not only the conflict of the refresh requests but also a conflict of a write to the DRAM and a read from the DRAM with the refresh request to the DRAM.

Figure 6:
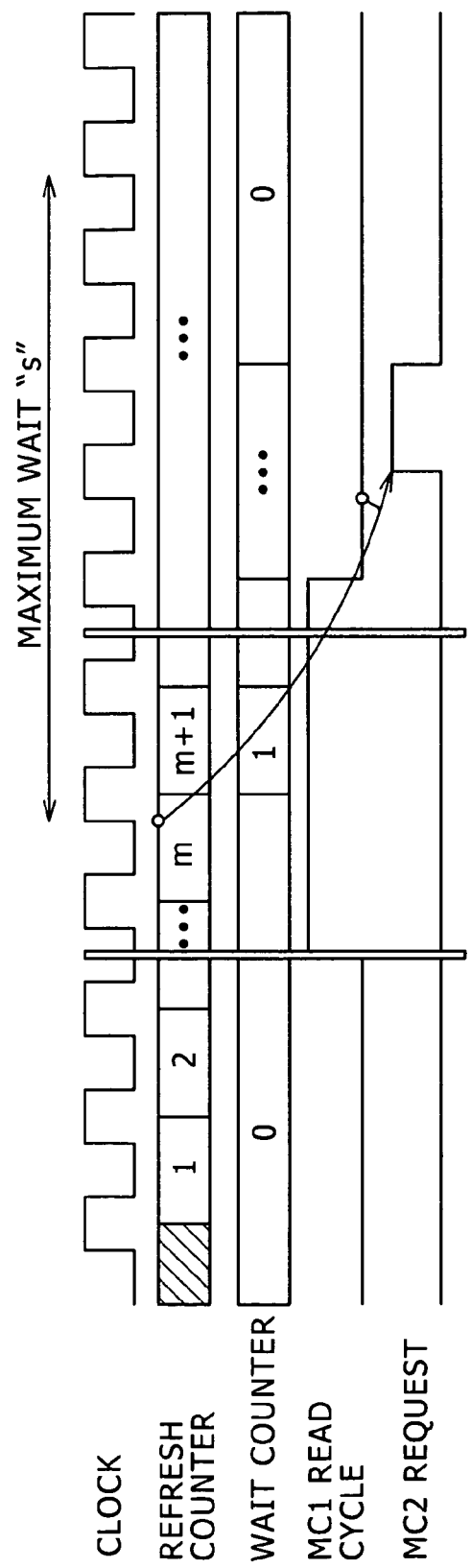
FIG. 6 is a diagram for explaining an exemplary case where, while a read from the DRAM, which is connected to the memory control section, is being performed, a refresh request to the DRAM, which is connected to the memory control section, is about to be outputted.

FIG. 6 is a diagram for explaining an exemplary case where, while a read from the DRAM 136, which is connected to the memory control section 128 (MC1), is being performed, the refresh request to the DRAM 138, which is connected to the memory control section 130 (MC2), is about to be outputted.

It is assumed in the example of FIG. 6 that the conflicting command threshold setting in the refresh setting section 162 is set to 0, i.e., no conflict is to be permitted, and that the refresh request maximum wait setting and the external refresh interval setting are set to s (s is a natural number) and m (m is a natural number), respectively.

In the case of the above settings, the refresh control section 164 attempts to issue the refresh request to the external DRAM 138 when the refresh counter has reached m. However, since the memory control section 128 (MC1) is performing a read from the DRAM 136 at the time, the memory control section 128 needs to suspend the issuance of the refresh request until the read from the DRAM 136 is completed.

In this case, when the refresh counter has reached m, the wait counter starts. If the read from the DRAM 136 is completed before the wait counter reaches s, the refresh control section 164 issues, to the memory control section 130, the refresh request to the DRAM 138.

As described above, it is possible to control the timing with which the refresh request is issued to a memory, not only when the refresh is performed in another memory but also when the read/write is being performed in the other memory, and thereby to prevent an increase in operating current.

Figure 7:
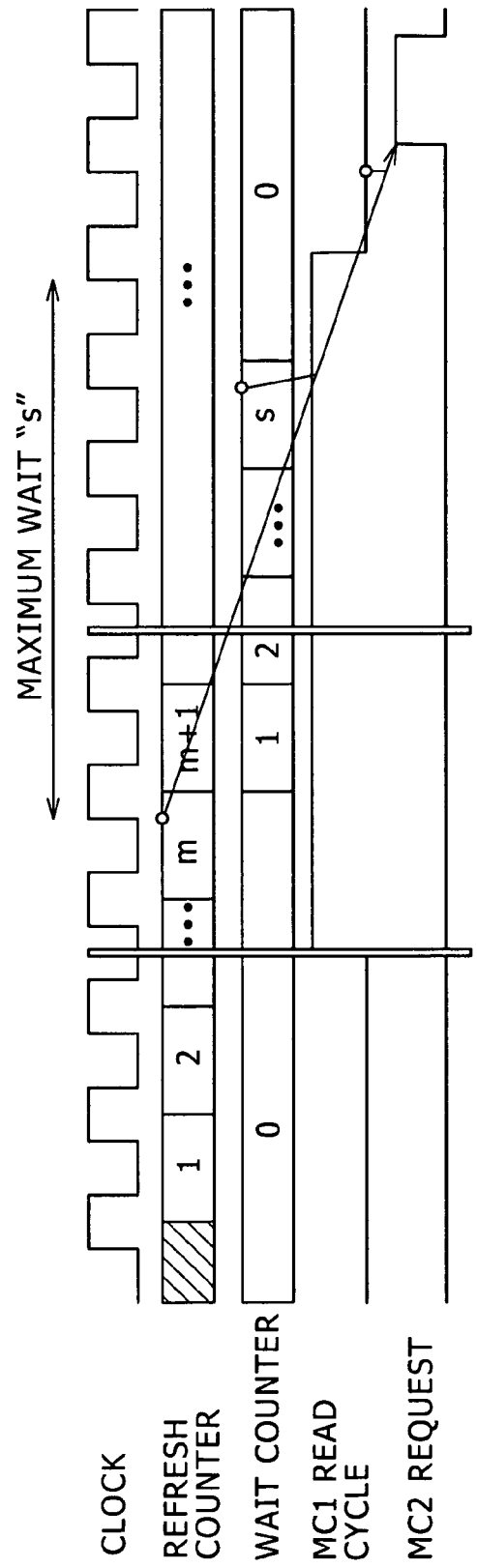
FIG. 7 is a diagram for explaining an exemplary case where, while a read from the DRAM, which is connected to the memory control section, is being performed, the refresh request to the DRAM, which is connected to the memory control section, is about to be outputted.

Similar to FIG. 6, FIG. 7 is a diagram for explaining an exemplary case where, while a read from the DRAM 136, which is connected to the memory control section 128 (MC1), is being performed, the refresh request to the DRAM 138, which is connected to the memory control section 130 (MC2), is about to be outputted. In the example of FIG. 7, the read from the DRAM 136 has not been completed yet when the wait counter has reached s.

In this case, when a burst transfer that is currently being performed in the memory control section 128 (MC1) has been completed, the refresh request to the DRAM 138 is issued without a next read command being issued from the main sequencer 166. The next read command is issued from the main sequencer 166 when the refresh of the DRAM 138 has been completed.

As described above, when the predetermined period of time has elapsed, the refresh operation is performed in preference to the read/write operation, so that the loss of the data in the DRAM is avoided, and the timing with which the refresh request is issued is controlled to prevent an increase in operating current.

Note that, if the burst transfer is not completed before a period of time corresponding to a refresh interval defined for the DRAM elapses since the last refresh operation, the data in the DRAM is lost. It is therefore desirable that, if the burst transfer is not completed before the period of time corresponding to the refresh interval defined for the DRAM elapses since the last refresh operation, the refresh request be issued to the DRAM even if the read/write operation is being performed in the other DRAM. Also note that it is desirable that the value of the refresh request maximum wait setting be set, taking into account the possibility that the burst transfer may not be completed before the period of time corresponding to the refresh interval defined for the DRAM elapses since the last refresh operation.

The operations of the memory control sections 128 and 130 according to the first embodiment of the present invention have been described above. Note that, although the number of memory control sections is two in the present embodiment, the number of memory control sections may be greater than two in other embodiments of the present invention.

As described above, according to the first embodiment of the present invention, where one DRAM is connected to each of the memory control sections 128 and 130, the timing with which the refresh requests are issued to the DRAMs is controlled to avoid the conflict of the refresh commands and thereby to prevent an increase in operating current. In addition, the timing with which the refresh operations are performed is controlled while taking into account the timing with which the read/write operations are performed. This contributes to avoiding the conflict of the refresh command with the read/write command and thereby to preventing an increase in operating current.

Second Embodiment

In the first embodiment of the present invention, one DRAM is connected to each of the plurality of memory control sections. In a second embodiment of the present invention, a plurality of DRAMs are connected to one memory control section.

Figure 8:
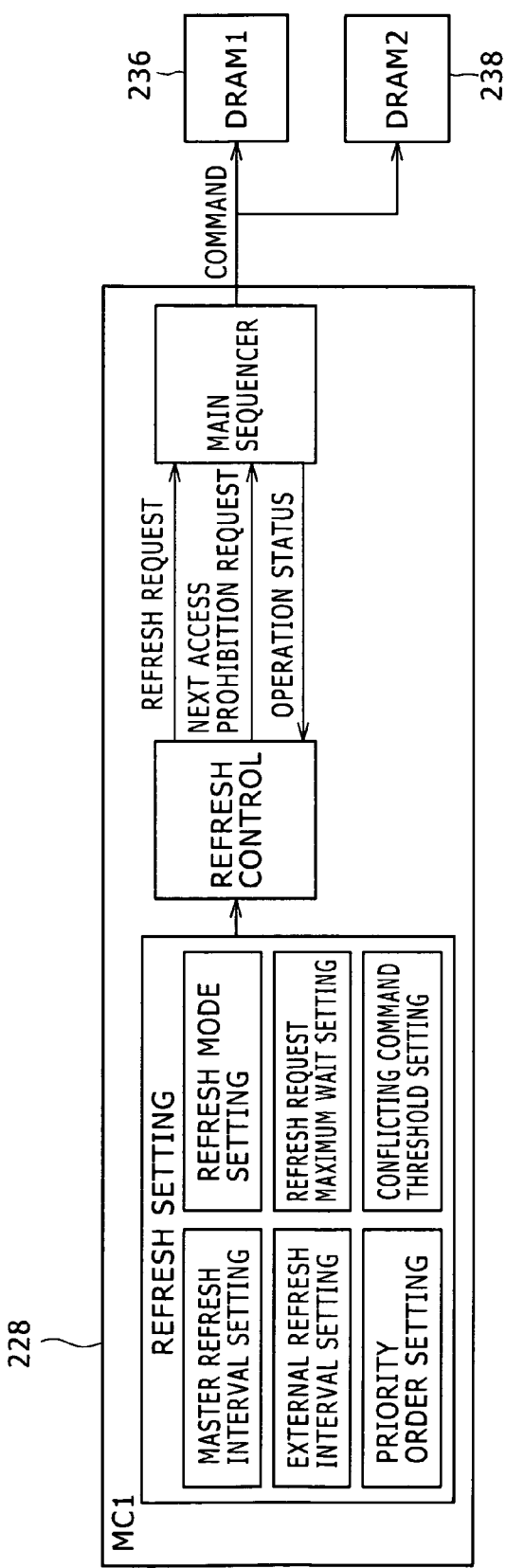
FIG. 8 is a diagram for explaining the structure of a memory control section according to a second embodiment of the present invention.

FIG. 8 is a diagram for explaining the structure of a memory control section 228 according to the second embodiment of the present invention. The structure of the memory control section 228 according to the second embodiment of the present invention will now be described below with reference to FIG. 8.

The memory control section 228 controls DRAMs 236 and 238. As shown in FIG. 8, the memory control section 228 according to the second embodiment of the present invention includes a refresh setting section 262, a refresh control section 264, and a main sequencer 266. In FIG. 8, the DRAMs 236 and 238 are denoted as DRAM1 and DRAM2, respectively.

Similar to the refresh setting section 162 according to the first embodiment of the present invention, the refresh setting section 262 is used to make various settings concerning the refresh requests to the DRAMs 236 and 238. As in the case of the refresh setting section 162, items set in the refresh setting section 262 include the master refresh interval setting, the refresh mode setting, the external refresh interval setting, the refresh request maximum wait setting, the priority order setting, and the conflicting command threshold setting. Of these items, the master refresh interval setting is used to make settings concerning the two DRAMs 236 and 238. The other items are the same as their counterparts in the first embodiment of the present invention.

Based on the items set in the refresh setting section 262, the refresh control section 264 notifies the main sequencer 266 of the refresh request. Similar to the refresh control section 164 according to the first embodiment of the present invention, the refresh control section 264 contains the refresh counter and the wait counter. In the present embodiment, there is only one memory control section, i.e., the memory control section 228, and there is no other memory control section to be notified of the refresh request. Note, however, that the number of memory control sections is not limited to one in the present invention. In the case where there are two or more memory control sections, one memory control section may notify another memory control section of the refresh request.

The main sequencer 266 generates and issues the commands for the DRAMs 236 and 238 in compliance with AC specifications of a device that uses the write command, the read command, the refresh command, and so on.

The memory control section 228 according to the second embodiment of the present invention has been described above. Next, the operation of the memory control section 228 according to the second embodiment of the present invention will now be described below.

Figure 9:
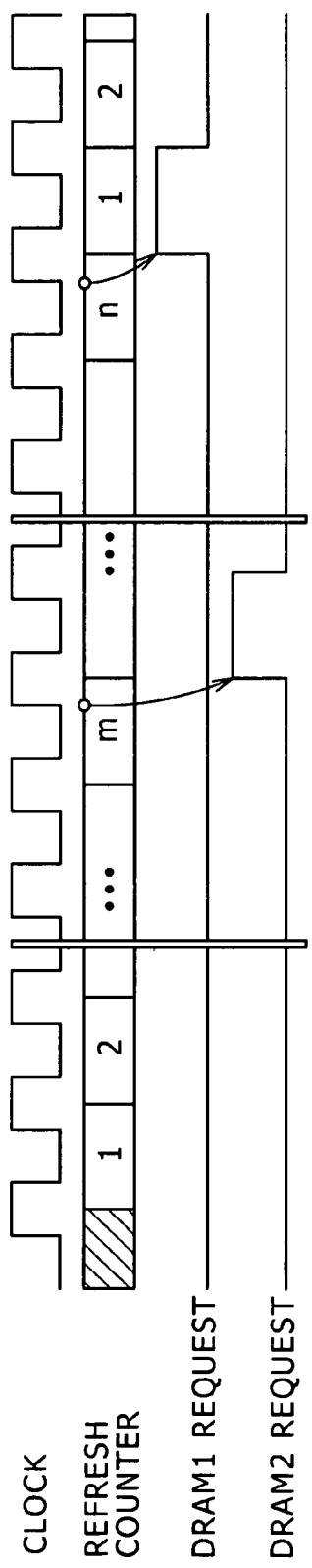
FIG. 9 is a diagram for explaining a case where the refresh requests are issued to DRAMs.

FIG. 9 is a diagram for explaining a case where the refresh requests are issued to the DRAMs 236 and 238. In the example of FIG. 9, it is assumed that the DRAM 236 (DRAM1) and the DRAM 238 (DRAM2) have the same refresh interval.

In this case, the main sequencer 266 is notified of the refresh request to the DRAM 238 (DRAM2) (DRAM2 request) when the refresh counter in the refresh control section 264 has reached m (m is a natural number), and the main sequencer 266 is notified of the refresh request to the DRAM 236 (DRAM1) (DRAM1 request) when the refresh counter in the refresh control section 264 has reached n (n is a natural number greater than m).

As described above, the notification of the refresh requests to the two DRAMs is provided at different times so that two refresh operations may not conflict, whereby an increase in operating current is prevented.

Figure 10:
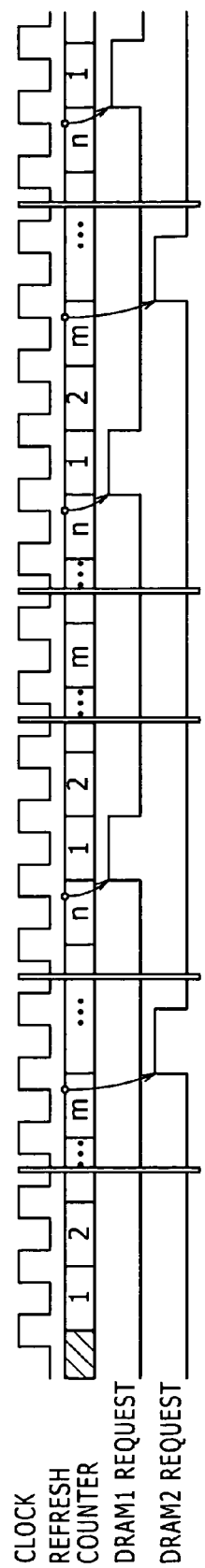
FIG. 10 is a diagram for explaining a case where the refresh requests are issued to the DRAMs.

FIG. 10 is a diagram for explaining a case where the refresh requests are issued to the DRAMs 236 and 238. In the example of FIG. 10, it is assumed that the DRAM 236 (DRAM1) and the DRAM 238 (DRAM2) have different refresh intervals. Specifically, it is assumed that the DRAM 236 needs 8192 refresh operations every 64 milliseconds whereas the DRAM 238 needs 4096 refresh operations every 64 milliseconds.

In this case, the DRAM 236 requires twice as many refresh operations as the DRAM 238 in a given period. In this case, the main sequencer 266 is notified of the refresh request to the DRAM 236 (DRAM1) (DRAM1 request) when the refresh counter in the refresh control section 264 has reached n (n is a natural number), and the main sequencer 266 is notified of the refresh request to the DRAM 238 (DRAM2) (DRAM2 request) when the refresh counter in the refresh control section 264 has reached m (m is a natural number greater than n) but only every other time.

In this case also, the notification of the refresh requests to the two DRAMs is provided at different times as described above so that two refresh operations may not conflict, whereby an increase in operating current is prevented.

The operation of the memory control section 228 according to the second embodiment of the present invention has been described above with reference to the two exemplary cases.

As described above, according to the second embodiment of the present invention, where two DRAMs are connected to the memory control section 228, the timing with which the refresh requests are issued to the DRAMs is controlled so as to avoid the conflict of the refresh commands and thereby to prevent an increase in operating current.

In addition, as in the first embodiment of the present invention, the timing with which the refresh operations are performed may be controlled while taking into account the timing with which the read/write operations are performed. This will contribute to avoiding the conflict of the refresh command with the read/write command and thereby to preventing an increase in operating current.

While preferred embodiments of the present invention have been described above with reference to the accompanying drawings, it should be understood that the present invention is not limited to the above-described embodiments. It should be understood by those skilled in the art that various modifications, combinations, sub-combinations and alterations may occur depending on design requirements and other factors insofar as they are within the scope of the appended claims or the equivalents thereof.

The present invention is applicable to a memory control apparatus, a memory control method, and a computer program. In more detail, the present invention is applicable to a memory control apparatus, a memory control method, and a computer program for controlling a plurality of memories that require periodic refresh.

What is claimed is:

1. A memory control apparatus, comprising
a plurality of memory control sections, each of which is connected to one or more memories that require periodic refresh and is configured to perform commands that consume high power including data write, data read, and refresh operations on the one or more memories,
wherein said plurality of memory control sections issue, to each of the one or more memories, refresh commands at optimum intervals and with arbitrary timing such that the commands that consume high power do not conflict with each other.

2. The memory control apparatus according to claim 1, wherein each of said plurality of memory control sections includes a memory control setting section configured to set a threshold number of conflicts of write/read commands and the refresh commands.

3. The memory control apparatus according to claim 2, wherein the memory control section is configured for setting a maximum wait time for which issuance of a refresh request is suspended when the number of occurring conflicts exceeds the threshold number.

4. The memory control apparatus according to claim 3, wherein, if the number of occurring conflicts continues to exceed the threshold number even after the maximum wait time has elapsed, one of said plurality of memory control sections causes one of said plurality of memory control sections that is continually performing a write/read operation on the memory to suspend issuance of the write/read commands upon completion of a current burst transfer.

5. The memory control apparatus according to claim 3, wherein an order of priority among the memory control sections determines an access suspension for one or more of the memory control sections having commands remaining to be completed when the maximum wait time has elapsed, to allow completion of the refresh request.

6. A memory control apparatus, comprising
a memory control section that is connected to a plurality of memories that require periodic refresh and is configured to perform commands that consume high power including data write, data read, and refresh operations on the memories,
wherein said memory control section issues, to each of the memories, refresh commands at optimum intervals and with arbitrary timing such that the commands that consume high power do not conflict with each other.

7. The memory control apparatus according to claim 6, wherein said memory control section includes a memory control setting section configured to set a threshold number of conflicts of write/read commands and the refresh commands.

8. The memory control apparatus according to claim 7, wherein the memory control section is configured for setting a maximum wait time for which issuance of a refresh request is suspended when the number of occurring conflicts exceeds the threshold number.

9. The memory control apparatus according to claim 8, wherein, if the number of occurring conflicts continues to exceed the threshold number even after the maximum wait time has elapsed, said memory control section suspends issuance of the write/read commands upon completion of a current burst transfer.

10. The memory control apparatus according to claim 8, wherein an order of priority among the memory control sections determines an access suspension for one or more of the memory control sections having commands remaining to be completed when the maximum wait time has elapsed, to allow completion of the refresh request.

11. A memory control method employed in a memory control apparatus including:

a plurality of memory control sections, each of which is connected to one or more memories that require periodic refresh and is configured to perform commands that consume high power including data write, data read, and refresh operations on the one or more memories, the method comprising:

issuing, to each of the one or more memories, refresh commands at optimum intervals and with arbitrary timing such that the commands that consume high power do not conflict with each other.

12. The memory control method according to claim 11, wherein said issuing further comprises setting, by a memory control setting section included by each of said plurality of memory control sections, a threshold number of conflicts of write/read commands and the refresh commands.

13. The memory control method according to claim 12, wherein said setting further comprises determining a maximum wait time for which issuance of a refresh request is suspended when the number of occurring conflicts exceeds said threshold number.

14. The memory control method according to claim 13, wherein said determining further comprises causing, by one of said plurality of memory control sections if the number of occurring conflicts continues to exceed the threshold number even after the maximum wait time has elapsed, one of said plurality of memory control sections that is continually performing a write/read operation on the memory to suspend issuance of the write/read commands upon completion of a current burst transfer.

15. A memory control method employed in a memory control apparatus including a memory control section that is connected to a plurality of memories that require periodic refresh and is configured to perform commands that consume high power including data write, data read, and refresh operations on the memories, the method comprising:

issuing, to each of the memories, refresh commands at optimum intervals and with arbitrary timing such that the commands that consume high power do not conflict with each other.

16. A non-transitory computer readable medium storing computer program for causing a computer to perform commands that consume high power including data write, data read, and refresh operations on one or more connected memories that require periodic refresh, the program being executable because the computer to perform:

issuing, to each of the one or more memories, refresh commands at optimum intervals and with arbitrary timing such that the commands that consume high power do not conflict with each other.

17. The non-transitory computer readable medium according to claim 16, wherein said issuing further comprises setting, by a memory control setting section included by each of said plurality of memory control sections, a threshold number of conflicts of write/read commands and the refresh commands.

18. The non-transitory computer readable medium according to claim 17, wherein said setting further comprises determining a maximum wait time for which issuance of a refresh request is suspended when the number of occurring conflicts exceeds said threshold number.

19. The non-transitory computer readable medium according to claim 18, wherein said determining further comprises causing, by one of said plurality of memory control sections if the number of occurring conflicts continues to exceed the threshold number even after the maximum wait time has elapsed, one of said plurality of memory control sections that is continually performing a write/read operation on the memory to suspend issuance of the write/read commands upon completion of a current burst transfer.

20. A non-transitory computer readable medium storing computer program for causing a computer to perform commands that consume high power including data write, data read, and refresh operations on a plurality of connected memories that require periodic refresh, the program being executable because the computer to perform:

issuing, to each of the memories, refresh commands at optimum intervals and with arbitrary timing such that the commands that consume high power do not conflict with each other.

* * * * *